United States Patent [19]

Sarubbi et al.

[11] Patent Number: 5,350,827
[45] Date of Patent: Sep. 27, 1994

[54] SELECTED STRUCTURALLY DEFINED NOVOLAK BINDER RESINS AND THEIR USE IN RADIATION-SENSITIVE COMPOSITIONS

[75] Inventors: Thomas R. Sarubbi, Providence, R.I.; Joseph J. Sizensky, Seekonk, Mass.

[73] Assignee: OCG Microelectronic Materials, Inc., West Paterson, N.J.

[21] Appl. No.: 194,292

[22] Filed: Feb. 9, 1994

Related U.S. Application Data

[62] Division of Ser. No. 787,454, Nov. 4, 1991, Pat. No. 5,306,594.

[51] Int. Cl.$^5$ .............. C08G 8/04; C08G 8/10
[52] U.S. Cl. .............. 528/155; 528/151; 528/153; 528/156; 528/165; 528/212; 528/219
[58] Field of Search .............. 528/151, 153, 155, 156, 528/165, 212, 219

[56] References Cited

U.S. PATENT DOCUMENTS

| | | | |
|---|---|---|---|
| 4,387,152 | 6/1983 | Stahlhofen | 430/192 |
| 4,424,270 | 1/1984 | Erdmann et al. | 430/193 |
| 4,439,511 | 3/1984 | Stahlhofen | 430/193 |
| 4,457,999 | 7/1984 | Stahlhofen | 430/192 |
| 4,536,465 | 8/1985 | Uehara et al. | 430/192 |
| 4,957,846 | 9/1990 | Jefferies, III et al. | 430/193 |
| 4,970,287 | 11/1990 | Blakeney et al. | 430/192 |
| 5,023,311 | 6/1991 | Kubota | 430/192 |
| 5,112,719 | 5/1992 | Yamada et al. | 430/165 |
| 5,128,230 | 7/1992 | Templeton et al. | 430/192 |

OTHER PUBLICATIONS

Honda et al. "Studies of Dissolution Inhibition Mechanism of DNQ-Novolak Resist [II] Effect of Extended Ortho-Ortho Bond in Novolak", SPIE vol. 1466 Advances in Resist Technology & Processing VIII (1991) p. 141 et seq.

*Primary Examiner*—John Kight, III
*Assistant Examiner*—Richard Jones
*Attorney, Agent, or Firm*—William A. Simons

[57] ABSTRACT

A novolak resin composition comprising at least one unit of the reaction product of a para-, para-bonded bisphenol having formula (A):

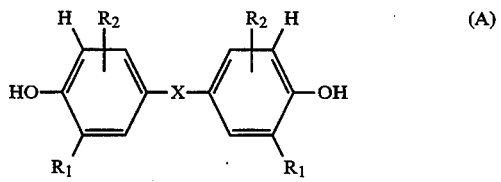

wherein $R_1$=hydrogen, lower alkyl group having 1-4 carbon atoms, halogen, or lower alkoxy group having 1-4 carbon atoms;
wherein $R_2$=hydrogen or lower alkyl group having 1-4 carbon atoms; and
wherein X is selected from the group consisting of: $CH_2$, $CH(CH_3)$, $C(CH_3)_2$, O, and S;

with a bismethylol monomer selected from a difunctional ortho-, ortho-phenolic bismethylol of Formula (B), a difunctional ortho-, para-phenolic bismethylol of Formula (C):

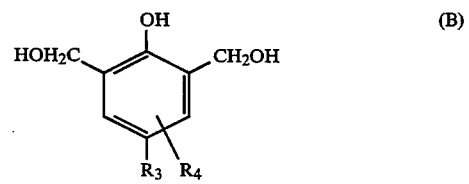

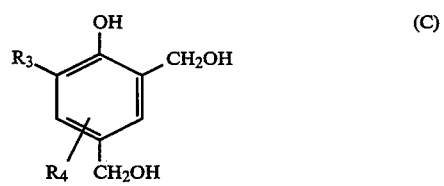

wherein $R_3$ is selected from $CH_3$, $CH_2CH_3$, Cl, and Br; and
wherein $R_4$ is selected from H and $CH_3$.

5 Claims, No Drawings

SELECTED STRUCTURALLY DEFINED NOVOLAK BINDER RESINS AND THEIR USE IN RADIATION-SENSITIVE COMPOSITIONS

This application is a division of application Ser. No. 7/787,454 filed Nov. 4, 1991, now U.S. Pat. No. 5,306,594 which is incorporated herein by reference in its entirety.

BACKGROUND OF THE INVENTION

1. Field of the Invention

The present invention relates to selected structurally defined novolak resins containing at least one unit which is a condensation reaction product of a selected para-, para-bonded bisphenol containing at least one unsubstituted ortho position to the hydroxyl on each aromatic ring with either a selected difunctional ortho-, ortho-phenolic bismethylol, or a selected difunctional ortho-, para-phenolic bismethylol, or a combination of such bismethylols.

Furthermore, the present invention relates to radiation-sensitive compositions useful as positive-working photoresist compositions, particularly, those containing these phenolic resins and o-quinonediazide photosensitizers. Still further, the present invention also relates to substrates coated with these radiation-sensitive compositions as well as the process of coating, imaging, and developing these radiation-sensitive mixtures on these substrates.

2. Brief Discussion of the Prior Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some instances, it may be desirable to bake the imaged coated substrate after the imaging step and before the developing step. This bake step is commonly called a post-exposure bake and is used to increase resolution.

There are two types of photoresist compositions—negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g., a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less is necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

Increased resolution has been noted in positive photoresist systems whose novolaks possess a high degree of ortho-, ortho-bonding. The term ortho-, ortho-bonding is used to refer to the location and positions of attachment of the methylene bridge between phenolic nuclei. Thus, the bridge which connects two phenolic nuclei which is ortho to both phenolic hydroxyl groups is regarded as ortho, ortho.

It is thought that ortho-, ortho-bonding increases the interactions between the novolak and the photoactive compound in positive photoresists compared to positive photoresists containing novolaks which lack a high degree of ortho-, ortho-bonding in their microstructure. Although the exact character of these interactions is speculative, e.g., hydrogen bonding, van der Waals forces, and the like, there is a correlation between increased resolution and contrast observed in these positive resists whose novolaks contain a high degree of ortho-, ortho-bonding compared to positive resists whose novolaks lack this high degree of ortho-, ortho-bonding.

Furthermore, it is also known that the incorporation of trimeric ortho-, ortho-blocks into a novolak is a more efficient use of ortho-, ortho-bonding. See Honda et al, "Studies of Dissolution Inhibition Mechanism of DNQ-Novolak Resist [II] Effect of Extended Ortho-Ortho Bond in Novolak", *SPIE Vol. 1466, Advances in Resist Technology and Processing VIII* (1991), page 141 et seq. It is also believed that dimeric ortho-, ortho blocks in the novolak aid in improving resist performance. Monomeric ortho-, ortho-units and those larger than trimeric are less effectual in improving resist performance. Thus, less overall ortho-, ortho-bonding content is needed when it is incorporated in dimeric and trimeric form.

The present invention makes use of these dimeric and trimeric ortho-, ortho-blocks to achieve a novolak resin which can result in a photoresist having advanced lithographic properties.

BRIEF SUMMARY OF THE INVENTION

One object of the present invention is directed to a new type of novolak resin with well-defined structural features which incorporates ortho-, ortho-bonding into the novolak resin in the form of dimeric or trimeric units or both types of units.

Another object of the present invention is to make a novolak resin wherein the above-noted dimeric or trimeric units are homogeneously distributed throughout the polymer.

Still another object is to make a novolak resin whereby the structure, ortho-, ortho-content, and block type are defined by a reactive combination of monomeric precursors encompassing a mixture of:
(1) a para-, para-bonded bisphenol containing at least one unsubstituted position ortho to the hydroxyl on each aromatic ring; with
(2) either a difunctional ortho-, ortho-phenolic bismethylol, or difunctional ortho-, para-phenolic bismethylol, or a combination of such bismethylols.

And further, the present invention is directed to incorporating those novolak resins into photoresist formulations which will have improved resolution due to the efficient incorporation of ortho-, ortho-bonding as well as having increased thermal resistance.

Accordingly, the present invention is directed to a novolak resin composition comprising at least one unit of the reaction product of a para-, para-bonded bisphenol having formula (A):

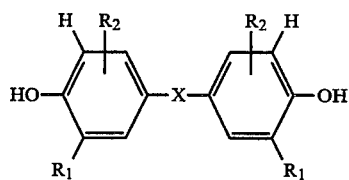

wherein $R_1$=hydrogen, lower alkyl group having 1–4 carbon atoms, halogen, or lower alkoxy group having 1–4 carbon atoms;
wherein $R_2$=hydrogen or lower alkyl group having 1–4 carbon atoms; and
wherein X is selected from the group consisting of $CH_2$, $CH(CH_3)$, $C(CH_3)_2$, O, and S;
with a bismethylol monomer selected from a difunctional ortho-, ortho-phenolic bismethylol of formula (B), a difunctional ortho-, para-phenolic bismethylol of formula (C), or mixtures thereof:

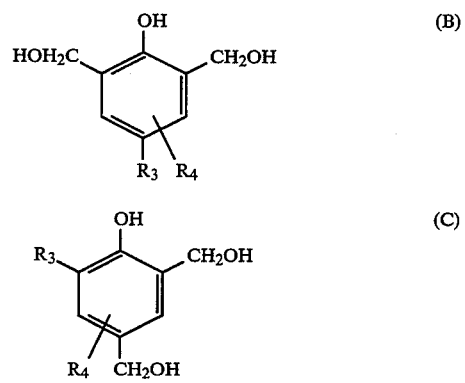

wherein $R_3$ is selected from $CH_3$, $CH_2CH_3$, Cl, and Br; and
wherein $R_4$ is selected from H and $CH_3$.

Moreover, the present invention is directed to a radiation-sensitive composition useful as a positive photoresist comprising an admixture of o-quinonediazide compound and binder resin comprising at least one unit of the condensation product described above; the amount of said o-quinonediazide compound or compounds being about 5% to about 40% by weight and the amount of said binder resin being about 60% to 95% by weight, based on the total solid content of said radiation-sensitive composition.

Also further, the present invention encompasses said coated substrates (both before and after imaging) as novel articles of manufacture.

Still further, the present invention also encompasses the process of coating substrates with these radiation-sensitive compositions and then imaging and developing these coated substrates.

DETAILED DESCRIPTION

The bisphenol monomers of formula (A) are selected para-, para-bonded bisphenols containing at least one unsubstituted ortho position on each aromatic ring. The preferred bisphenol monomers are those wherein $R_1=CH_3$, H, Cl, Br, or $OCH_3$; $R_2=H$ or $CH_3$; and $X=CH_2$, $CH(CH_3)$ or $C(CH_3)_2$. The most preferred bisphenol monomer is 2,2''-bis(4-hydroxy-3-methylphenyl) propane (BHMPP) wherein $R_1=CH_3$; $R_2=H$; and $X=C(CH_3)_2$.

These bisphenol monomers are either commercially available or may be prepared by known methods including the reaction of excess phenolic with an appropriate aldehyde or ketone.

The difunctional ortho-, ortho-phenolic bismethylol of formula (B) may be any 2,6-bismethylol of a phenol with at least a nonreactive para substituent as defined by formula (B). The preferred difunctional ortho-, ortho-phenolic bismethylols have $R_3=CH_3$ or $CH_2CH_3$ and $R_4=H$. The most preferred difunctional ortho-, ortho-phenolic bismethylol is p-cresol bismethylol (BHMPC) (wherein $R_3=CH_3$ and $R_4=H$). Other illustrative difunctional ortho-, ortho-phenolic bismethylols include the following:

The 2,6-bismethylol of 3,4-dimethylphenol, 4-ethylphenol, 4-chlorophenol, 4-bromophenol, 3-methyl-4-chlorophenol, 3-methyl-4-bromophenol, 3-methyl-4-ethylphenol, 3-chloro-4-ethylphenol, and 3-bromo-4-ethylphenol.

These difunctional ortho-, ortho-monomers are either commercially available or may be prepared by conventional processes for making phenolic bismethylols.

The difunctional para-, ortho-phenolic bismethylols of formula (C) may be any 2,4-bismethylol of a phenol with at least a nonreactive ortho substituent as defined by formula (C). The preferred difunctional para-, ortho-phenolic bismethylol have $R_3=CH_3$ or $CH_2CH_3$ and $R_4=H$. The most preferred difunctional para-, ortho-phenolic bismethylol is o-cresol bismethylol (BHMOC) (wherein $R_3=CH_3$ and $R_4=H$). Other illustrative difunctional ortho-, para-phenolic bismethylols include the following:

The 2,4-bismethylol of 2,3-dimethylphenol, 2,5-dimethylphenol, 2-ethylphenol, 2-chlorophenol, 2-bromophenol, 3-methyl-2-chlorophenol, 3-methyl-2-bromophenol, 3-methyl-2-ethylphenol, 3-chloro-2-ethylphenol, 3-bromo-2-ethylphenol 5-methyl-2-chlorophenol, 5-methyl-2-bromophenol, 5-methyl-2-ethylphenol, 5-chloro-2-ethylphenol, and 5-bromo-2-ethylphenol.

These difunctional para-, ortho-phenolic bismethylols are either commercially available or may be prepared (as described by F. S. Granger, Industrial and Engineering Chemistry, Vol, 24, No. 4, pp. 442-448) by reacting the desired phenolic at room temperature with two mole equivalents of formaldehyde and one mole equivalent of sodium hydroxide in the form of a 20% aqueous solution. After the reaction is complete, the solution is neutralized with acetic acid. Over time, the bismethylol crystallizes and is isolated by filtering, washing with water, and drying in vacuo to constant weight.

The reaction of the monomers of formula (A) with the monomers of formula (B) form novolak resins which have only dimeric ortho-, ortho-blocks. For example, the reaction of BHMPP and BHMPC form the following structure (D):

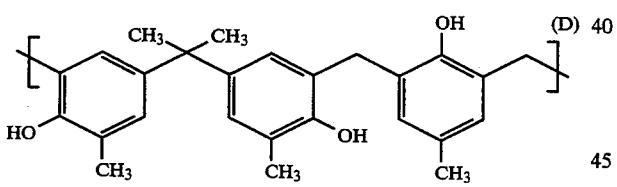

The reaction of the monomers of formula (A) with the monomers of formula (C) form novolak resins which have only trimeric ortho-, ortho-blocks. For example, the reaction of BHMPP and BHMOC form the following structure (E):

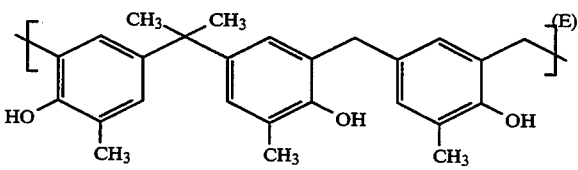

The structure is so well defined that the weight percent dimer and trimer ortho-, ortho-blocks can be easily calculated from the monomer feed ratios. For example, polymerizing BHMPP with both BHMOC and BHMPC gives a novolak which contains both ortho-, ortho-dimer, and trimer blocks in known amounts. The content of the type of methylene bridging (ortho-ortho, ortho-para, or para-para) may also be exactly defined. Such calculations would be valid since all three monomer reactants are all difunctional and reaction proceeds unambiguously.

Preferred mole ratios of the monomers of formula (A) to the combined monomers of formulae (B) and (C) would be from about 1:0.8 to about 1:1.2.

Preferred mole ratios of the monomers of formula (B) to formula (C) depends on the particular end use and the novolak alkali solubility required for that use.

In making the present class of resins, the precursors, compounds of formulae (A), (B), and (C) are placed in a reaction vessel which also contains an acid catalyst and solvent. The mixture is then heated to a temperature in the range from about 60° C. to about 120° C., more preferably from about 80°-110° C., for the condensation polymerization process to occur. The reaction time will depend on the specific reactants and catalyst used. Reaction times from 1-24 hours are generally suitable. The reaction volatiles and solvent are then removed by distillation to yield the desired product.

Typical catalysts include oxalic acid, maleic acid, hydrochloric acid, sulfonic acids, and other acid catalysts known to those skilled in the art of novolak synthesis. Preferred catalysts include oxalic and maleic acid. The most preferred catalyst is oxalic acid. The acid catalyst concentration may range from about 0.1% to about 2%.

Solvents which may be employed are those of medium polarity which are not extremely acid and/or water sensitive. Suitable solvents include ethereal solvents such as tetrahydrofuran (THF) and dioxane, alcoholic solvents such as ethanol, butanol, and 1-methoxy-2-propanol, or other solvents. Preferred solvents are the alcoholic or ethereal solvents with boiling points between 80° and 220° C. The novolak is then isolated by the removal of solvent and the water of condensation by atmospheric distillation followed by moderate vacuum distillation. Both distillations may be carried out at 200° to 230° C.

The above-discussed resins of the present invention may be mixed with photoactive compounds to make radiation-sensitive mixtures which are useful as positive acting photoresists. The preferred class of photoactive compounds (sometimes called sensitizers) is o-quinonediazide compounds particularly esters derived from polyhydric phenols, alkyl-polyhydroxyphenones, aryl-polyhydroxyphenones, and the like which can contain up to six or more sites for esterification. The most preferred o-quinonediazide esters are derived from o-naphthoquinone-(1,2)-diazide-4-sulfonic acid and o-naphthoquinone-(1,2) diazide-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzo phenone 1,2-naphthoquinonediazide- 4-sulfonic acid esters, 2,4,6-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4',6'-pentahydroxybenzophenone 1,2-naphthoquinonediazide-5-sulfonic acid esters, and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters, and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, aryl-polyhydroxyphenone, and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta-, and hexa-esters of polyhydroxy compounds having at least 2 hydroxyl groups, i.e. about 2 to 6 hydroxyl groups, are most preferred. These 1,2-quinonediazide compounds may be used alone or in combination of two or more.

Among these most preferred 1,2-naphthoquinone-5-diazide compounds are 2,3,4-trihydroxybenzophenone 1,2-naphthoquinonediazide-5-sulfonic acid esters, and 2,3,4,4'-tetrahydroxybenzophenone 1,2-naphthoquinonediazide-5-sulfonic acid esters.

The proportion of the sensitizer compound in the radiation-sensitive mixture may preferably range from about 5 to about 40%, more preferably from about 10 to about 25% by weight of the nonvolatile (e.g., nonsolvent) content of the radiation-sensitive mixture. The proportion of total binder resin of this present invention in the radiation-sensitive mixture may preferably range from about 60% to about 95%, more preferably, from about 75 to 90% of the nonvolatile (e.g., excluding solvents) content of the radiation-sensitive mixture.

These radiation-sensitive mixtures may also contain conventional photoresist composition ingredients such as other resins, solvents, actinic, and contrast dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresol-formaldehyde resins, phenol-cresol-formaldehyde resins and polyvinylphenol resins commonly used in the photoresist art. If other binder resins are present, they will replace a portion of the binder resins of the present invention. Thus, the total amount of the binder resin in the radiation-sensitive composition will be from about 60% to about 95% by weight of the total nonvolatile solids content of the radiation-sensitive composition.

The resins and sensitizers may be dissolved in a solvent or solvents to facilitate their application to the substrate. Examples of suitable solvents include methoxyacetoxy propane, ethyl cellosolve acetate, n-butyl acetate, diglyme, ethyl lactate, ethyl 3-ethoxy propionate, propylene glycol alkyl ether acetates, or mixtures thereof and the like. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g., Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g., 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)]. The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555), and Calco Red A (C.I. No. 26125) up to 10% weight levels, based on the combined weight of resin and sensitizer.

Anti-striation agents level out the photoresist coating or film to a uniform thickness. Anti-striation agents may be used up to 5% weight levels, based on the combined weight of resin and sensitizer. One suitable class of anti-striation agents is nonionic silicon-modified polymers. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(B-chloroethyl)-ester; stearic acid; dicamphor; polypropylene; acetal resins; phenoxy resins; and alkyl resins up to 10% weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid, or nitrocinnamic acid at weight levels of up to 20%, based on the combined weight of resin and sensitizer.

The prepared radiation-sensitive resist mixture, can be applied to a substrate by any conventional method used in the photoresist art, including dipping, spraying, whirling, and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum, or polymeric resins, silicon dioxide, doped silicon dioxide, silicon resins, gallium arsenide, silicon nitride, tantalum, copper, polysilicon, ceramics, and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° to 125° C. until substantially all the solvent has evaporated and only a uniform radiation-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

A novolak resin was prepared in a round bottom flask by the acidic condensation of 2,2″-bis(4-hydroxy-3-methylphenyl)propane (BHMPP) with o-cresol bismethylol (BHMOC). Thus, BHMPP (10.00 g, 39.0 mmoles) and BHMOC (6.56 g, 39.0 mmoles) were added to a round bottom flask (125 mL). To this mixture were added 1-methoxy-2-propanol (5.00 g) as solvent and oxalic acid (0.17 g, 1 weight percent relative to phenolics) as the acidic reaction catalyst.

The reaction flask was then heated in a 140° C. oil bath and stirred. As the mixture heated, it became a homogeneous, clear, light yellow solution. The polymerization reaction proceeded for 20 hours. After that time the oil temperature was increased to 230° C. to atmospherically distill off the water of condensation as well as the solvent, and to decompose the catalyst. Moderate vacuum was then applied for a short time to ensure removal of volatiles.

After cooling, 14.06 g of light yellow, glassy polymer were isolated. This corresponds to a 93% yield based on theoretical weight of polymer expected (15.16 g) for 100% condensation of the monomers.

The time to clear ($T_c$) and molecular weight data for this polymer are given in Table 1. The theoretical dimer and trimer block content of each novolak were calculated. These calculations are given in Table 2 below.

EXAMPLE 2

The procedure of Example 1 was repeated except that BHMPP (40.00 g, 156.0 mmoles) was added to a round bottom flask (500 mL). To this were added a mixture of BHMOC (22.30 g, 132.6 mmoles) and BHMPC (3.94 g, 23.4 mmoles), 1-methoxy-2-propanol (20.00 g) as solvent and oxalic acid (0.68 g, 1 wt % relative to phenolics) as the acidic reaction catalyst.

The resulting light yellow glassy polymer weighed 61.60 g, which correspond to 102% yield, based on theoretical weight of polymer expected (60.64 g) for 100% condensation of the monomers.

The measured $T_c$ and molecular weight data are given below in Table 1. The calculated content of dimer and trimer blocks are given in Table 2 below.

EXAMPLE 3

The procedure of Example 1 was repeated except that BHMPP (40.00 g, 156.0 mmoles) was added to a round bottom flask (500 mL). To this was added a mixture of BHMOC (20.99 g, 124.8 mmoles) and BHMPC (5.25 g, 31.2 mmoles), 1-methoxy-2-propanol (20.00 g) as solvent and oxalic acid (0.68 g, 1 wt % relative to phenolics) as the acidic reaction catalyst.

The resulting light yellow glassy polymer weighed 62.64 g, which corresponds to 103% yield, based on theoretical weight of polymer expected (60.64 grams) for 100% condensation of the monomers.

The measured $T_c$ and molecular weight data are given below in Table 1. The calculated content of dimer and trimer blocks are given in Table 2 below.

EXAMPLE 4

The procedure of Example 1 was repeated except that a mixture of BHMOC (4.92 g, 29.2 mmoles) and BHMPC (1.64 g, 9.8 mmoles) were employed instead of the pure BHMOC reactant.

The resulting light yellow glassy polymer weighed 15.2 g, which corresponds to 100% yield, based on theoretical weight of polymer expected (15.16 g) for 100% condensation of the monomers.

The measured $T_c$ and molecular weight data are given below in Table 1. The calculated content of dimer and trimer blocks are given in Table 2 below.

EXAMPLE 5

The procedure of Example 1 was repeated except that a mixture of BHMOC (3.28 g, 19.5 mmoles) and BHMPC (3.28 g, 19.5 moles) were employed instead of the pure BHMOC reactant.

The resulting light yellow glassy polymer weighed 11.87 g which corresponds to 78% yield, based on theoretical weight of polymer expected (15.16 g) for 100% condensation of the monomers.

The measured $T_c$ and molecular weight data are given below in Table 1. The calculated content of dimer and trimer blocks are given in Table 2 below.

EXAMPLE 6

The procedure of Example 1 was repeated again except that pure BHMPC (6.56 g, 39.0 mmoles) were employed instead of the pure BHMOC reactant and no solvent was added.

The resulting light yellow glassy polymer weighed 11.87 g, which corresponds to 101% yield, based on theoretical weight of polymer expected (15.34 g) for 100% condensation of the monomers.

The measured $T_c$ and molecular weight data are given below in Table 1. The calculated content of dimer and trimer blocks are give in Table 2 below.

TABLE 1

| Example No. | Methylol Feed Stock | | $T_c$ | $M_w$ | $M_n$ | $M_w/M_n$ |
| --- | --- | --- | --- | --- | --- | --- |
| | % BHMPC | % BHMOC | | | | |
| 1 | 0 | 100 | 4 sec | 2707 | 1117 | 2.42 |
| 2 | 15 | 85 | 119 sec | 5690 | 1854 | 3.10 |
| 3 | 20 | 80 | 146 sec | 6278 | 1956 | 3.21 |
| 4 | 25 | 75 | 150 sec | 7584 | 2117 | 3.58 |
| 5 | 50 | 50 | >750 sec | 9143 | 2502 | 3.65 |
| 6 | 100 | 0 | >750 sec | 3512 | 1360 | 2.58 |

TABLE 2

| Example No. | Type of Methylene Bond | | | Weight % Trimer Block[a] | Weight % Dimer Block[a] |
| --- | --- | --- | --- | --- | --- |
| | % o—o | % o—p | % p—p | | |
| 1 | 33.33 | 33.33 | 33.33 | 0.00 | 66.67 |
| 2 | 38.33 | 28.33 | 33.33 | 15.00 | 56.10 |
| 3 | 40.00 | 26.67 | 33.33 | 20.00 | 52.80 |
| 4 | 41.67 | 25.00 | 33.33 | 25.00 | 50.00 |
| 5 | 50.00 | 16.67 | 33.33 | 50.00 | 33.00 |
| 6 | 66.67 | 0.00 | 33.33 | 100.00 | 0.00 |

[a] Calculations are based on the assumption of infinite molecular weight. The actual values should be slightly lower due to the degree of polymerization less than infinite. However, they should represent reasonable estimates.

Times to Clear

The time to clear ($T_c$) for this and the other polymers was measured using a dual channel development rate monitor (DRM). One micron thick films of the polymer were spin cast in Si/SiO$_2$ wafers. The coatings were developed by immersion in 0.236N aqueous tetramethylammonium hydroxide solution and the development rate was monitored by DRM. The $T_c$ is defined as the time in seconds to develop the one micron coating.

Molecular Weights

The molecular weight of the polymers was measured by gel permeation chromatography (GPC) on a Phenomenex Phenogel 10 four column set (50, 100, 500, and 10,000 A). The elution solvent was tetrahydrofuran and the flow rate was 1.0 mL/min at 35° C. The molecular weights were determined relative to narrow polystyrene standards. The weight average ($M_w$) and number average ($M_n$) molecular weights as well as polymer dispersity ($M_w/M_n$) for these polymers is given in Table I. The GPC traces show significant differences relative to conventionally prepared novolak. The polymer dispersity is low (2.4 to 3.7). There are relatively little low molecular weight species in the polymer.

Preparation of Photoresist Formulations

Photoresist formulations may be prepared by dissolving in ethyl lactate three parts by weight of some of the alkali-soluble resins made above with one part photoactive compound prepared by condensation of 1 mole 2,3,4,4'-tetrahydroxy-benzophenone with 2.75 moles o-napthoquinone-(1,2)-diazide-5-sulfonic acid chloride.

After mixing, the formulation may be filtered through an 0.2 micron pore size filter.

Photoresist Processing

A. Photoresist Coatings

Photoresist solutions so prepared as above may be spin-coated onto four inch silicon wafers, which is primed with hexamethyldisilazane (HMDS). The coated wafers may be soft baked on a hot plate for 50 seconds at 110° C. Uniform coatings, of about 1.2 micron in thickness may be obtained by spinning at velocities ranging from 4,000 to 6,000 RPM for 30 seconds, depending upon the solution viscosity. If necessary, the solids content may be adjusted to fit this spin speed range.

B. Exposure of Photoresist Coatings

Photoresist coatings may be exposed on a Canon G line step and repeat exposure tool equipped with a 0.43 numerical aperture lens. This exposure tool provides a narrow spectral output at 436 nm.

C. Development of Exposed Photoresist Coatings

The exposed photoresist coatings may be puddle developed using a 2.38% weight percent tetramethyl ammonium hydroxide aqueous developer solution in a two second spray and 58 second dwell cycle followed by rinsing and spin drying.

D. Photoresist Performance Evaluations

The photoresist formulations may be evaluated for photospeed; line and space resolution; scum; and profile.

The photoresists made from the novolaks of the above should exhibit good profiles, useful photospeeds, submicron line, and space resolution with no scum.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A novolak resin composition consisting of the reaction product of a para-, para-bonded bisphenol having formula (A):

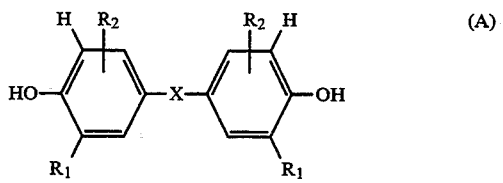

wherein $R_1$=lower alkyl group having 1-4 carbon atoms, halogen, or lower alkoxy group having 1-4 carbon atoms;

wherein $R_2$=hydrogen or lower alkyl group having 1-4 carbon atoms; and wherein X is selected from the group consisting of $CH_2$, $CH(CH_3)$, $C(CH_3)_2$, O, and S;

with a bismethylol monomer selected from a difunctional ortho-, ortho-phenolic bismethylol of formula (B), a difunctional ortho-, para-phenolic bismethylol of formula (C), or mixtures thereof:

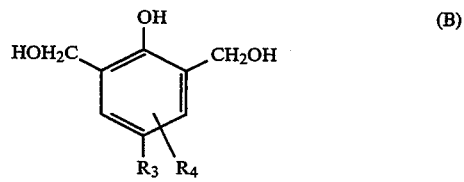

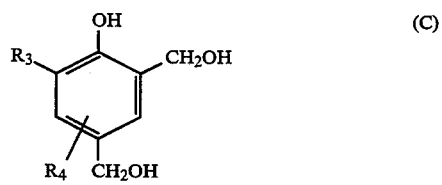

wherein $R_3$ is selected from $CH_3$, $CH_2CH_3$, Cl and Br; and wherein $R_4$ is selected from H and $CH_3$.

2. The novolak resin of claim 1 wherein the mole ratio of the monomers of formula (A) to the combined monomers of formulae (B) and (C) is from about 1:0.8 to about 1:1.2.

3. The novolak resin of claim 1 wherein $R_1$=$CH_3$, Cl, Br, or $OCH_3$; $R_2$=H or $CH_3$; and X=$CH_2$, $CH(CH_3)$, or $C(CH_3)_2$ in formula (A).

4. The novolak resin of claim 1 wherein $R_3$=$CH_3$ or $C(CH_2)_3$; and $R_4$=H in both formulae (B) and (C).

5. The novolak resin of claim 1 wherein said para-, para-bonded bisphenol is 2,2″-bis(4-hydroxy-3-methylphenyl) propane; wherein said difunctional ortho-, ortho phenolic bismethylol is p-cresol bismethylol; and wherein said para, ortho-phenolic bismethylol is o-cresol bismethylol.

* * * * *